United States Patent
Mehdi et al.

(10) Patent No.: US 10,243,464 B2
(45) Date of Patent: Mar. 26, 2019

(54) POWER REGULATOR WITH PREVENTION OF INDUCTOR CURRENT REVERSAL

(71) Applicant: TEXAS INSTRUMENTS INCORPORATED, Dallas, TX (US)

(72) Inventors: Syed Wasif Mehdi, Freising (DE); Neil Gibson, Freising (DE); Antonio Priego, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/854,061

(22) Filed: Dec. 26, 2017

(65) Prior Publication Data

US 2018/0294724 A1    Oct. 11, 2018

Related U.S. Application Data

(60) Provisional application No. 62/482,598, filed on Apr. 6, 2017.

(51) Int. Cl.
| | |
|---|---|
| *H02M 3/158* | (2006.01) |
| *G05F 1/62* | (2006.01) |
| *H02M 1/08* | (2006.01) |
| *H02J 1/10* | (2006.01) |
| *H02M 3/338* | (2006.01) |
| *H03K 17/16* | (2006.01) |
| *H02M 3/137* | (2006.01) |

(52) U.S. Cl.
CPC ............ *H02M 3/1582* (2013.01); *G05F 1/62* (2013.01); *H02J 1/10* (2013.01); *H02M 1/08* (2013.01); *H02M 3/137* (2013.01); *H02M 3/1588* (2013.01); *H02M 3/338* (2013.01); *H03K 17/164* (2013.01)

(58) Field of Classification Search
CPC .. H02M 3/1582; H02M 3/137; H02M 3/1588; H02M 3/338; G05F 1/62
See application file for complete search history.

(56) References Cited

U.S. PATENT DOCUMENTS

| | | | | |
|---|---|---|---|---|
| 6,381,159 B2* | 4/2002 | Oknaian | ............... | H02M 3/156 323/282 |
| 2013/0241516 A1* | 9/2013 | Ueno | ...................... | G05F 1/618 323/285 |
| 2014/0300326 A1* | 10/2014 | Yang | ..................... | H02J 7/0052 320/162 |
| 2017/0310216 A1* | 10/2017 | Gibson | ................. | H02M 3/158 |

* cited by examiner

*Primary Examiner* — Emily P Pham
(74) *Attorney, Agent, or Firm* — Andrew Viger; Charles A. Brill; Frank D. Cimino

(57) ABSTRACT

A controller including a voltage synthesizer for a switching regulator includes a synthesizer input to be coupled to an input of the regulator. First and second replica switching transistors are connected at a first node. A resistor couples between the first node and a second node, and a capacitor couples between the second node and ground. A transconductance stage compares a voltage sampled onto the capacitor to the output voltage of the regulator and generates an output signal in response to the comparison. A first switch couples between first and second inputs of the transconductance stage. The first switch is turned on during each cycle of operation of the voltage synthesizer to reset the capacitor voltage to the output voltage of the regulator.

20 Claims, 3 Drawing Sheets

POWER REGULATOR WITH PREVENTION OF INDUCTOR CURRENT REVERSAL

RELATED APPLICATIONS

This application claims priority to U.S. Provisional Application No. 62/482,598, filed Apr. 6, 2017, titled "Ultra-Fast (Single Pole) Time Regulation System," which is incorporated herein by reference.

BACKGROUND

The ever increasing demand of integrated electronic devices in automotive, industrial, and customer platforms requires more sophisticated power conversion and distribution designs. Often these electronic devices include embedded processors, memories, and other electronic components that are operated from one battery source which supplies a direct current (DC) voltage. DC-to-DC power regulators are used to generate different voltages from an input voltage source (e.g., a battery) to different electronic components within an electronic device. DC-to-DC regulators often operate in continuous and discontinuous conduction modes depending on the output load requirements. The DC-to-DC regulators typically enter the continuous mode under heavier load conditions and the discontinuous conduction mode under lighter load conditions to improve efficiency. However, DC-to-DC regulators can have operating anomalies that degrade their efficiency when operating in the discontinuous conduction mode.

SUMMARY

According to aspects of the disclosure, a power converter for use in a switching regulator system that includes a an inductor coupled to a load, the converter including a first power switch coupled between a input voltage node and a first switch node, a second power switch coupled between the first switch node and ground, an inductor coupled between the first switch node and an output voltage node. An output voltage synthesizer is coupled to the input and output voltage nodes. The output voltage synthesizer includes a transconductance stage, a third switch coupled between first and second inputs of the transconductance stage, and a controller. The synthesizer is synthesizes the voltage at the first switch node to produce a synthesized output voltage. The first input of the transconductance stage receives the synthesized output voltage and the second input receives the output voltage from the output voltage node. The controller closes the third switch to thereby reset the synthesized voltage in each cycle of operation.

According to other aspects of the disclosure, a switching regulator system includes a first power transistor coupled between an input voltage node and a first switch node, a second power transistor coupled between the first switch node and a ground, and an inductor coupled between the first switch node and an output voltage node. A first capacitor is coupled between the output voltage node and ground. A third replica transistor is coupled between the input voltage node and a second switch node. the third replica transistor being a replica of the first power transistor. A fourth transistor is coupled between the second switch node and ground, the fourth replica transistor being a replica of the first power transistor. A resistor is coupled to the second switch node. A transconductance stage includes a first input coupled to the resistor and a second input coupled to the output voltage node. A fifth switch is coupled between the first and second inputs of the transconductance stage.

According to other aspects of the disclosure, a voltage synthesizer for at least partially regulating a switching regulator that includes first and second power transistors, the voltage synthesizer including a synthesizer input coupled to an input of the switching regulator. A first replica transistor is coupled between the synthesizer input and a first node, the first replica transistor being a replica of the first power transistor. A second replica transistor is coupled between the first node and ground. A resistor is coupled between the first node and a second node. A capacitor is coupled between the second node and ground. A transconductance stage also is included to compare a voltage of the capacitor received on a first input of the transconductance stage to the output voltage of the regulator received on a second input of the transconductance stage and to generate an output signal in response to the comparison. A third switch is coupled between the first and second inputs of the transconductance stage. The third switch is turned on during each cycle of operation of the voltage synthesizer to reset the capacitor voltage to the output voltage of the regulator.

BRIEF DESCRIPTION OF THE DRAWINGS

For a detailed description of various examples, reference will now be made to the accompanying drawings in which.

DETAILED DESCRIPTION

Figure 1:
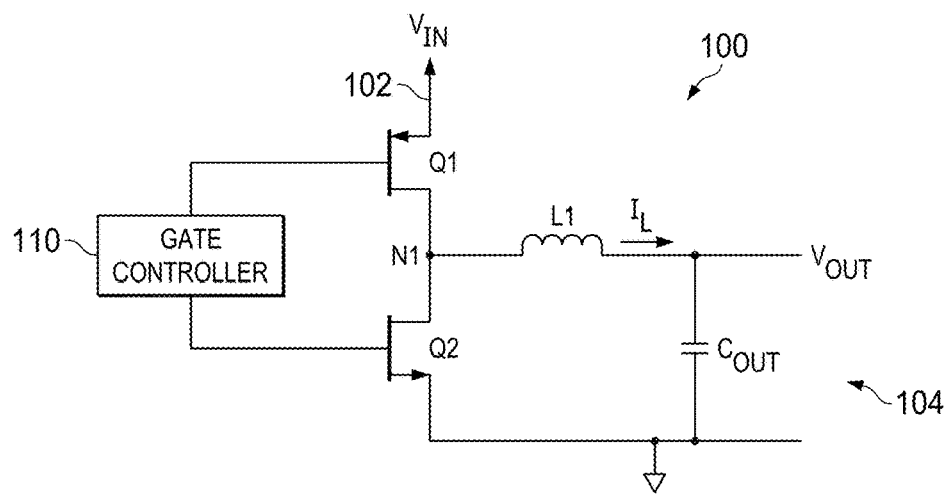
FIG. 1 is a schematic diagram of a switching regulator in accordance with an example.

FIG. 1 is a schematic diagram of an example power (switching) regulator 100 (also referred to as a switched mode power supply or SMPS), with a buck topology. The regulator 100 includes a high-side switch, which is referred to as transistor Q1, and a low-side switch, which is referred to as transistor Q2, an inductor L1, and a capacitor $C_{OUT}$. In the example of FIG. 1, transistor Q1 is a p-channel transistor and transistor Q2 is an n-channel transistor, although other transistor types can be used in other examples. The source of transistor Q1 is coupled to an input voltage node 102 which receives an input voltage $V_{IN}$. During operation of the regulator 100, the input voltage 102 operates at the input voltage $V_{IN}$, which is a DC voltage that is to be converted to another DC voltage by the regulator 100. The drain of transistor Q1 is coupled to a node N1 (also referred to as a switch node). The drain of transistor Q2 is coupled to the node N1 and the source of transistor Q2 is coupled to a ground node. The ground node may operate at a potential of ground or another potential that is different than or lower than the input voltage $V_{IN}$.

A first terminal of the inductor L1 is coupled to the node N1. The second terminal of the inductor L1 is coupled to the capacitor $C_{OUT}$, which form an LC output filter. The junction of the inductor L1 and the capacitor $C_{OUT}$ is the output node 104 of the regulator 100, on which a regulated output voltage $V_{OUT}$ is generated.

The gates of transistors Q1 and Q2 are coupled to a gate controller 110 that generates control signals to switch on and off the transistors Q1 and Q2 with a controlled duty cycle. Accordingly, the gate controller 110 serves as a switch controller to control the switching function, including duty cycle, of transistors Q1 and Q2. The regulator 100 receives the input voltage $V_{IN}$ at the input 102. The gate controller 110 turns transistors Q1 and Q2 off and on, so that while one transistor is on, the other transistor is off. The off and on period (TON/TOFF) controls the current $I_L$ flowing through the inductor L1. The current $I_L$ supplies load current and charges the capacitor $C_{OUT}$, and the capacitor's voltage is the regulated output voltage $V_{OUT}$ of the regulator 100. In the discontinuous mode of operation, in each of cycle Q1 is switched on for a period of time (while Q2 is off), and then Q2 is switched on (while Q1 is off), followed by both transistors Q1 and Q2 being switched off at the same time for a period of time. The cycle then repeats over and over.

Figure 2:
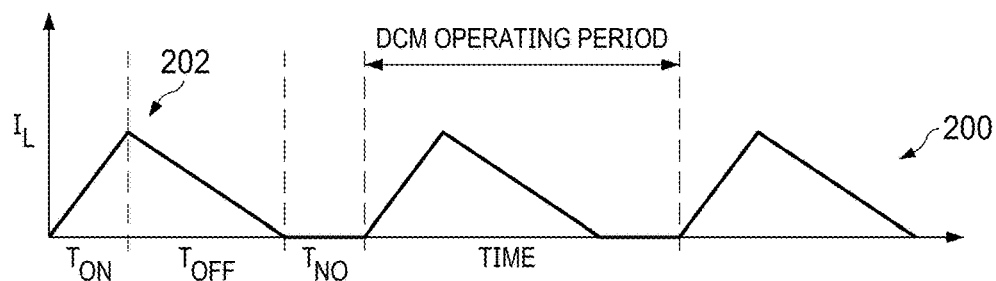
FIG. 2 is a graph showing the current through the regulator's inductor as a function of the states of regulator's high and low side transistor switches.

FIG. 2 is a graph showing the current $I_L$ through the inductor L1 as a function of time. The waveform 200 of the current $I_L$ is substantially triangular in response to the duty cycle switching of Q1 and Q2. When Q1 is on, Q2 is off and when transistor Q1 is off, Q2 is on as shown by a triangular waveform 202. Both transistors Q1 and Q2 are off during the periods between triangular waveforms, which are designated $T_{NO}$. The gate controller 110 determines the on and off time of the Q1 and Q2 to obtain the correct output voltage $V_{OUT}$. During a period referred to as the on-time $T_{ON}$, Q1 is on and Q2 is off, so the inductor current $I_L$ increases. During a period referred to as the off-time $T_{OFF}$, Q1 is off and Q2 is on, so the current $I_L$ decreases. The operation of the regulator 100 as shown by the waveform 200 of FIG. 2 is in a discontinuous mode (DCM) because there is period $T_{NO}$ when neither Q1 nor Q2 is on. The period of the waveform 200 is referred to as the DCM operating period and the inverse is the DCM operating frequency.

The DCM operation of the power regulator 100 maintains the efficiency of the regulator 100 when relatively light loads are coupled to the output node 104 and driven by the output voltage $V_{OUT}$. In the DCM, the current $I_L$ in the inductor L1 should not reverse direction because the reversal degrades the efficiency of the regulator 100. At higher loads, resistive losses are the main contributor to efficiency losses in the regulator 100. At light loads where DCM is used, switching and current reversal are the main contributors of efficiency losses. Current reversal in DCM has a two-fold impact on efficiency degradation. First, current reversal degrades efficiency by discharging the capacitor $C_{OUT}$ and second, current reversal increases the switching frequency of the transistors Q1 and Q2, which contributes to switching losses. For example, the regulator 100 may use pulse frequency modulation (PFM) during DCM, so the switching frequency of the transistors Q1 and Q2 will increase if the inductor current $I_L$ reverses.

Therefore, a need exists to switch off transistor Q2 when the inductor current $I_L$ reaches zero to prevent inductor current reversal and thus to maximize the light load efficiency during DCM operation. Further, some electronic devices may be capable of operating in different power states such as a sleep state, a fully operational state, etc. The supply voltage to certain electrical components may need to vary from state to state. For example, a processor may operate with 1.75 V supply during the fully operational state, but at 0.5 V in a sleep state. A switching power regulator, such as that described herein, can adjust the on/off timing and thus the duty cycle of Q1 and Q2 to thereby change the magnitude of $V_{OUT}$. Dynamically changing the output voltage is referred to as dynamic voltage scaling (DVS). It would be desirable for the power regulator to implement DVS in such a way that the regulator stabilizes its output voltage rapidly. For example, an application for the use of a power regulator with DVS may require the regulator to change its output voltage at a rate of 1 V/microsecond. Thus, the regulator should comply with the DVS timing requirement, and do so in an efficient manner to save power, and avoid inductor current reversal during DCM operation.

The circuits and methods described herein predict rather than detect the inductor current $I_L$. More specifically, the circuits and methods synthesize output voltage from on/off timers to predict zero inductor current $I_L$ by relying on the volt*second balance of an inductor. As applied to the regulator 100, the on-time $T_{ON}$ is proportional to the inverse of the difference between the input voltage $V_{IN}$ and the output voltage $V_{OUT}$. The off-time $T_{OFF}$ is proportional to the inverse of the output voltage $V_{OUT}$. The synthesizer described herein synthesizes the output voltage of the regulator 100 and control the states of the transistors Q1 and Q2 to maintain the synthesized voltage approximately equal to the actual regulator output voltage. The on-time $T_{ON}$ is fixed for a given $V_{IN}$, $V_{OUT}$ and the off-time $T_{OFF}$ is controllable to generate the required off-time $T_{OFF}$ in a closed loop for a given $V_{IN}$ and $V_{OUT}$. During the constant on-time $T_{ON}$, the synthesizer charges a capacitor with a current proportional to the difference between the input voltage $V_{IN}$ and output voltage $V_{OUT}$. During the controllable off-time $T_{OFF}$, the synthesizer discharges the same capacitor with a current proportional to the output voltage $V_{OUT}$. By controlling the off-time $T_{OFF}$ so as to maintain the synthesized output voltage approximately equal to the regulator's actual output voltage $V_{OUT}$, the low side transistor Q2 is turned off at the zero current level of the inductor and thus before the current through the inductor would otherwise reverse its direction.

The disclosed synthesizer includes a transconductance stage which receives the synthesized output voltage and the actual output voltage $V_{OUT}$ as inputs. The synthesizer also includes a switch that is closed during each cycle to reset the error between the synthesized output voltage and the actual output voltage $V_{OUT}$ to avoid the transconductance stage from integrating the error over multiple cycles. By resetting the error in each cycle, the regulator's control loop is able to settle much faster than would have been the case if the error was not reset each cycle. This feature is particular useful for, for example, switching regulators that operate light loads in DCM operation and that implement dynamic voltage scaling.

Figure 3:
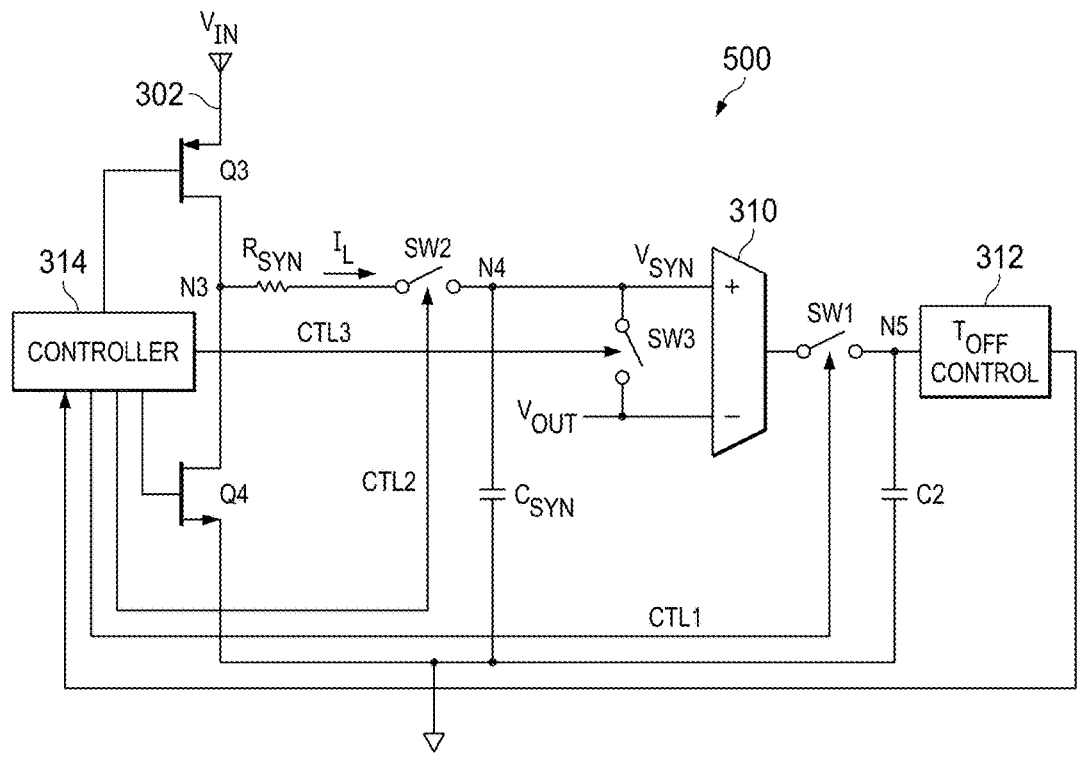
FIG. 3 is a schematic diagram of an example output voltage synthesizer according to this disclosure, for use in a switching regulator.

FIG. 3 is a schematic diagram of an example of an output voltage synthesizer 500 that employs the voltage conversion techniques described above. The voltage synthesizer is included in controller circuitry for a power regulator such as the example regulator 100 shown in FIG. 1, and as further shown in FIG. 6 and described below. The synthesizer 500 includes replica transistors Q3 and Q4, resistor $R_{SYN}$, capacitor $C_{SYN}$, switches SW1, SW2, and SW3, a transconductance stage 310 with capacitor C2 (also referred to as a gm/C integrator), and an off time (TOFF) control circuit 312. Switches SW1-SW3 may be implemented as transistors.

Transistors Q3 and Q4 are identical to, or substantially similar sized replicas of, the power switching transistors Q1 and Q2, respectively, of FIG. 1. Transistors Q3 and Q4 function as switches and may be substituted by other switching components. The source of Q3 is coupled between a voltage input node 302 and a node N3 (also termed a switching node). As is the case for input node 102, input node 302 receives the input voltage $V_{IN}$. Accordingly, the source of Q3 is at the $V_{IN}$ voltage potential. The drain of Q4 is coupled to the node N3 and the source of Q4 is coupled to ground. The ground is a potential that is different than the operating potential of the input voltage $V_{IN}$ and may be the same potential to which the source of transistor Q2 is coupled.

Resistor $R_{SYN}$ is coupled between nodes N3 and N4. The resistor $R_{SYN}$ synthesizes the current draw through the regulator 100 of FIG. 1 as described below. Capacitor $C_{SYN}$ is coupled between node N4 and ground. The voltage potential at node N4 is the synthesized output voltage $V_{SYN}$. The transconductance stage 310 has a first input coupled to node N4 and a second input coupled to the output node 104 of the regulator 100. Accordingly, the second input is at the potential of the output voltage $V_{OUT}$ of the regulator 100. The output of the transconductance (gm/C) stage 310 is coupled to switch SW1, and at node N5 to integration capacitor C2 (also referred to as a compensation capacitor). Switch SW1 is controlled by synthesizer controller 314 to be on during at least a portion of the $T_{NO}$ periods of FIG. 2. The output of the transconductance stage 310 is described herein as being a voltage; however, the transconductance stage 310 may generate signals other than voltages. The opposing terminal of switch SW1 is coupled to a node N5. Capacitor C2 and $T_{OFF}$ control circuit 312 are both coupled to node N5 as shown in the example of FIG. 3. Synthesizer controller 314 is coupled to the gates of transistors Q3 and Q4 and to switches SW1, SW2, and SW3, and generates control signals to control the states of Q3, Q4, and the switches. The synthesizer controller 314 generates control signal CTL1, CTL2, and CTL3 to control SW1, SW2, and SW3, respectively.

The value of $R_{SYN}$ is selected so that the current flow through resistor $R_{SYN}$ has the same form as the inductor current $I_L$ of FIG. 1. The resistor $R_{SYN}$ and the capacitor $C_{SYN}$ form a low pass filter for the input waveform generated at node N3. The selection of the time constant of the low pass filter of $R_{SYN}$ and $C_{SYN}$ provides a trade-off between speed and accuracy of the volt-sec balance regulation loop. If the time constant is small, the regulation loop settles faster but will have more inaccuracy. If the time constant is long, the regulation loop will take longer to settle, but will have fewer inaccuracies. In some examples, the time constant is selected to be 1/10 of the switching frequency of the transistors Q3 and Q4 to achieve a balance between accuracy and settling speed of the regulation loop.

Charging and discharging currents that synthesize the inductor current $I_L$ of FIG. 1 are developed as voltages across the resistor $R_{SYN}$. The charging current through $R_{SYN}$ to capacitor $C_{SYN}$ is proportional to the difference between the input voltage $V_{IN}$ on input node 302 and the output voltage $V_{SYN}$ at node N4. The discharging current is proportional to the synthesized output voltage $V_{SYN}$ at node N4. The voltage $V_{SYN}$ is filtered by the low pass filter of the resistor $R_{SYN}$ and the capacitor $C_{SYN}$, which replicates the output of a buck regulator, such as the example regulator 100 of FIG. 1. The synthesized output voltage $V_{SYN}$ is compared to the actual output voltage $V_{OUT}$ of the regulator 100 by the transconductance stage 310. The switch SW1 closes to charge the capacitor C2 to the voltage output by the transconductance stage 310 and opens to hold the voltage for input to the $T_{OFF}$ control circuit 312.

The $T_{OFF}$ control circuit 312 generates a signal that controls the off-time $T_{OFF}$ in both the regulator 100 and the synthesizer 500. For example, the signal generated by the $T_{OFF}$ control circuit 312 is processed by the synthesizer controller 314 and the gate controller 110 to set the off-time $T_{OFF}$. As can be seen in FIG. 3, the signal generated by the $T_{OFF}$ control circuit 312 closes a feedback loop in the synthesizer 500. In summary, the on-time $T_{ON}$ is always controlled by the synthesizer controller 314. The off-time $T_{OFF}$, however, is regulated and controlled by the $T_{OFF}$ control circuit 312 during DCM operation and is controlled by the synthesizer controller 314 in during CCM operation. During CCM operation, the regulator 100 may have much higher losses, such as power stage losses, so the actual off-time $T_{OFF}$ is smaller than the theoretical off-time $T_{OFF}$. Therefore, the synthesizer controller 314 overrides the $T_{OFF}$ control circuit 312 during CCM operation.

Figure 4A:
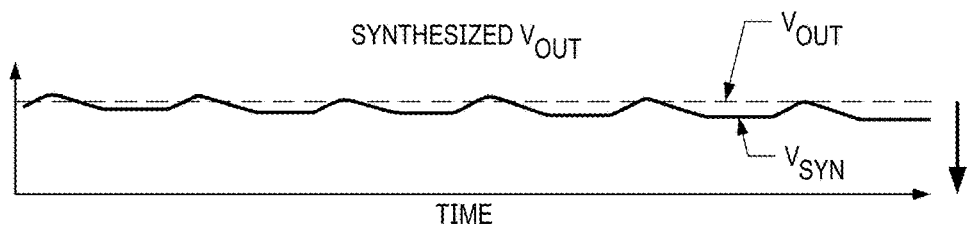
FIG. 4A is a graph illustrating an example synthesized output voltage from the example output voltage synthesizer of FIG. 3 falling below the output voltage from the power regulator.
Figure 4B:
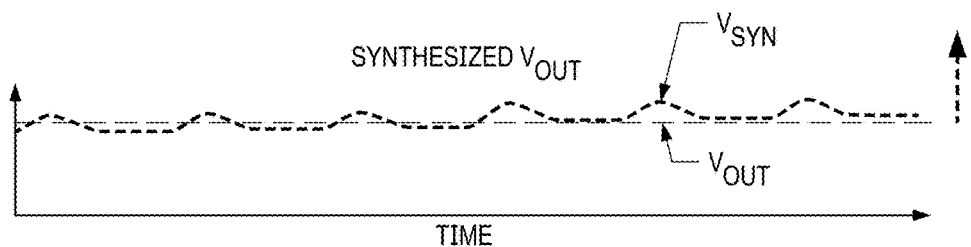
FIG. 4B is a graph illustrating an example synthesized output voltage from the example output voltage synthesizer of FIG. 3 increasing above the output voltage from the power regulator.

FIGS. 4A and 4B are graphs of examples of the synthesized output voltage $V_{SYN}$ generated by the synthesizer 500 of FIG. 3 and the output voltage $V_{OUT}$ generated by the regulator 100 of FIG. 1. If the off-time $T_{OFF}$ of FIG. 2 is too long, then the synthesized output voltage $V_{SYN}$ will be lower than the actual output voltage $V_{OUT}$ as shown in FIG. 4A. A correction voltage generated by the transconductance stage 310 goes low to cause the $T_{OFF}$ control circuit 312 to reduce the off-time $T_{OFF}$. If, however, the off-time $T_{OFF}$ is too short, then the synthesized output voltage $V_{SYN}$ will be higher than the actual output voltage $V_{OUT}$ as shown in FIG. 4B. In response, the output of the transconductance stage 310 generates a different correction voltage to cause the $T_{OFF}$ control circuit 312 to thereby increase the off-time $T_{OFF}$. In the steady state, the off-time $T_{OFF}$ will settle down to the required off-time $T_{OFF}$ to avoid current reversal through the inductor L1.

Referring again FIG. 3, switch SW3 is coupled between the inputs of the transconductance amplifier 310. As explained below, the synthesizer controller 314 asserts control signal SW3 to close (turn on) switch SW3 during each cycle of operation of the synthesizer 500 so as to reset the error difference between the synthesized output voltage $V_{SYN}$ and the actual output voltage $V_{OUT}$. Closing switch SW3 in each cycle effectively converts the integrated synthesized output voltage $V_{SYN}$ to a cycle-by-cycle synthesized voltage $V_{SYN}$. In this manner, a pole created by the combination of $R_{SYN}$ and $C_{SYN}$ is cancelled thereby increasing the speed at which the control loop of the synthesizer 500 settles.

Figure 5:
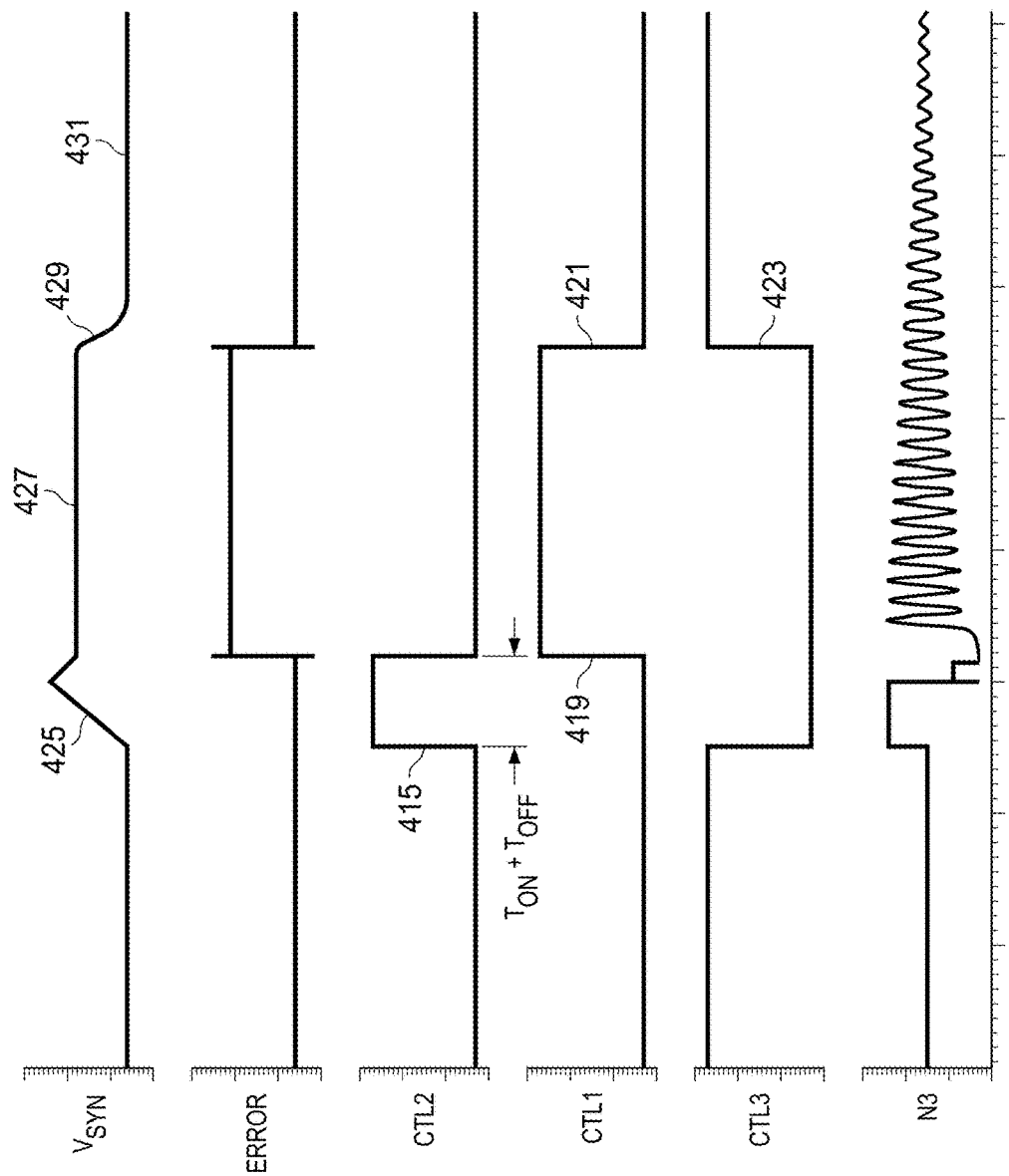
FIG. 5 is a timing diagram illustrating example waveforms of various signals within the power regulator in accordance with an example.

FIG. 5 shows a timing diagram pertaining to various signals in the circuit of FIG. 3. At the beginning of a cycle in which Q1 and Q3 are closed to and the inductor current begins to ramp up (as shown in FIG. 2), the synthesizer controller 314 asserts control signal CTL2 to switch SW2 to thereby turn on that switch. This point is shown at 415 in FIG. 5. Switch SW2 remains on during the period of time equal to $T_{ON}$ plus $T_{OFF}$. At the end of that period, the synthesizer controller 314 deasserts CTL2 to thereby turn off SW2 and asserts CTL1 (419) to turn on SW1 to cause the error difference (ERROR) between the synthesized output voltage $V_{SYN}$ and $V_{OUT}$ to be sampled on capacitor C2 and then to be received by the $T_{OFF}$ control circuit 312. The synthesizer controller 314 then deasserts CTL1 at 421 and asserts CTL3 at 423 to cause SW3 to be turned on to thereby reset $V_{SYN}$ to $V_{OUT}$. FIG. 5 also illustrates the synthesized output voltage waveform. As shown, $V_{SYN}$ accumulates ERROR while SW2 is on and applies this accumulated error across transconductance stage 310 via $C_{SYN}$ after SW2 being turned off. Once SW3 is turned on, $V_{SYN}$ decreases at 429 to a level at 431 equal to $V_{OUT}$. Node N3 is the output switch node as shown in FIG. 3. As ERROR is not zero yet, the back gate of the low side transistor is still conducting. Once the loop settles, the off time will regulate to the theoretical off time and the back gate conduction will vanish.

Figure 6:
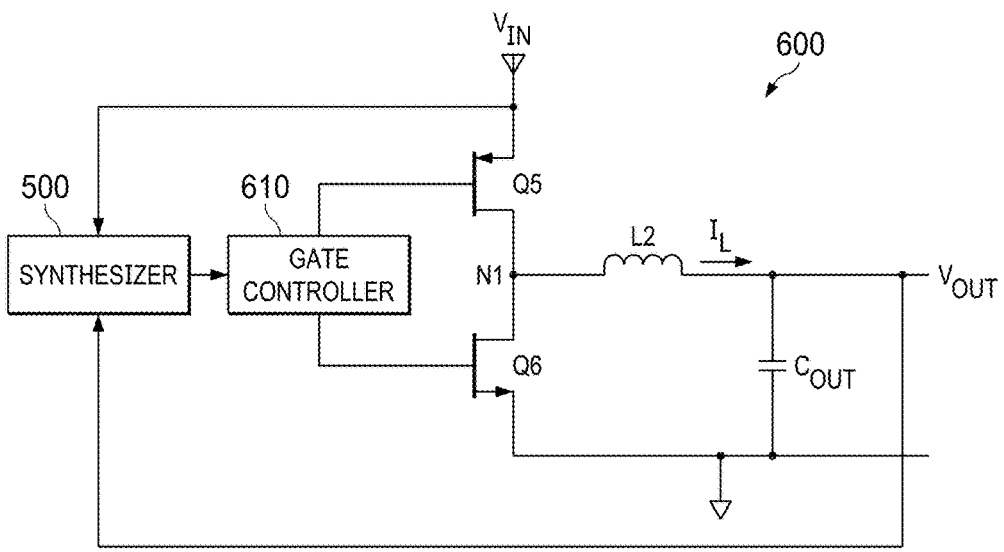
FIG. 6 is a block diagram of an example power converter having an output voltage synthesizer according to this disclosure.

FIG. 6 is a block diagram of an example buck regulator 600, with controller circuitry that includes voltage synthesizer 500 and gate controller 610. The regulator 600 is substantially similar to the regulator 100 of FIG. 1 with the addition of the synthesizer 500. The gate controller 610 controls the on-times and off-times of two transistors Q5 and Q6 in much the same manner that the gate controller 110 of FIG. 1 controls the on-times and off-times of transistors Q1 and Q2. The on-times and off-times of the transistors Q5 and Q6 determine the current flow $I_L$ through an inductor L2 and an output capacitor $C_{OUT}$.

The input voltage $V_{IN}$ and the output voltage $V_{OUT}$ are coupled to the synthesizer 500. The voltages $V_{IN}$ and $V_{OUT}$ are input to the synthesizer 500 to generate the $T_{OFF}$ signals, which are output to the gate controller 610 to control the on-time $T_{ON}$ and/or the off-time $T_{OFF}$. The synthesizer 500 prevents or reduces the likelihood that the current $I_L$ reverses through the inductor L2, which improves the efficiency of the regulator 600. In some examples, the synthesizer 500 and the gate controller 610 are integrated on a single semiconductor substrate and may be packaged together as a controller to couple to external power switching transistors Q5 and Q6.

The examples herein pertain to a buck regulator topology. However, the principles discussed can be applied to other topologies such as boost regulators. Also, the examples are described herein based on constant on-time (TON) with a controlled off time (TOff). TOff regulation is independent of the method used to derive the constant TON (i.e. the method is applicable to fixed frequency, hysteretic, fixed ripple or any other COT methodology). Also, other alternative examples can be based on a fixed off time TOFF, with controlled on time (TON) regulation according to this disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above description is meant to be illustrative of the principles of the disclosure, including and various examples. Numerous variations and modifications will become apparent to those skilled in the art once the above disclosure is fully appreciated. It is intended that the following claims be interpreted to embrace all such variations and modifications.

What is claimed is:

1. A converter for use in a switching regulator system that includes an inductor coupled at an output voltage node to a load, the converter to convert an input voltage to an output voltage at the output voltage node, the converter comprising:
   a first power switch coupled between an input voltage node and a first switch node;
   a second power switch coupled between the first switch node and a ground;
   the first switch node to couple to the inductor; and
   a controller including
      an output voltage synthesizer including:
         a transconductance stage with a third switch coupled between first and second inputs of the transconductance stage, and
         a synthesizer control circuit;
      the output voltage synthesizer to synthesize the output voltage to produce a synthesized output voltage;
      the first input of the transconductance stage to receive the synthesized output voltage and the second input to receive the output voltage from the output voltage node; and
      the synthesizer control circuit to close the third switch to reset the synthesized output voltage in each cycle of operation of the converter.

2. The converter of claim 1, wherein the output voltage synthesizer further includes:
   a fourth replica switch coupled between the input voltage node and a second switch node, the fourth replica switch being a replica of the first power switch;
   a fifth replica switch coupled between the second switch node and the ground, the fifth replica switch being a replica of the second power switch;
   a resistor coupled to the second switch node;
   a sixth switch coupled between the second switch node and the first input of the transconductance stage; and
   a first capacitor coupled between the first input of the transconductance stage and the ground.

3. The converter of claim 2, wherein the output voltage synthesizer further includes:
   an off time control circuit;
   a seventh switch coupled between an output of the transconductance stage and the off time control circuit; and
   a second capacitor coupled between the ground and a node interconnecting the seventh switch and the transconductance stage;
   wherein, during each cycle of operation of the converter, the control circuit generates control signals to:
      turn on the sixth switch during the time in which at least one of first and second power switches is on;
      turn on the seventh switch during the time in which neither the first or second power switch is on to thereby use the output of the transconductance stage to charge the third capacitor; and
      turn on the third switch to short the first and second inputs of the transconductance stage after a voltage on the second capacitor has been received by the off time control circuit.

4. The converter of claim 2, wherein the synthesizer control circuit asserts control signals to cause the time period during which the second power switch and the fifth replica switch are on to decrease in response to an output signal of the transconductance stage indicating that the synthesized output voltage is less than the output voltage on the output voltage node.

5. The converter of claim 2, wherein the controller asserts control signals to cause the time period during which the second power switch and fifth replica switch are on to increase in response to an output signal of the transconductance stage indicating that the synthesized output voltage is greater than the output voltage.

6. The converter of claim 1, further comprising:
an off time control circuit and a fourth switch coupled between an output of the transconductance stage and the off time control circuit; and
a first capacitor coupled between the ground and a node interconnecting the fourth switch and the transconductance stage;
wherein, responsive to a voltage on the first capacitor, the off time control circuit generates an output signal to the synthesizer control circuit to cause the synthesizer control circuit to adjust the off time of the period of time that the second switch is on.

7. A system including a switching regulator to convert an input voltage to an output voltage supplied to a load, comprising:
a first power transistor coupled between an input voltage node and a first switch node;
a second power transistor coupled between the first switch node and a ground;
an inductor coupled between the first switch node and an output voltage node;
a first capacitor coupled between the output voltage node and the ground;
a controller to control switching of the first and second power transistors; and
an output voltage synthesizer, including
a third replica transistor coupled between the input voltage node and a second switch node, the third replica transistor being a replica of the first power transistor;
a fourth replica transistor coupled between the second switch node and the ground, the fourth replica transistor being a replica of the first power transistor;
a resistor coupled to the second switch node;
a transconductance stage including a first input coupled to the resistor and a second input coupled to the output voltage node; and
a fifth switch coupled between the first and second inputs of the transconductance stage.

8. The system of claim 7, further comprising a sixth switch coupled between the resistor and the first input of the transconductance stage.

9. The system of claim 8, further comprising a seventh switch coupled to an output of the transconductance stage.

10. The system of claim 9, further comprising a synthesizer control circuit including the resistor and a second capacitor coupled between the resistor and the ground, and an off-time control circuit coupled to the seventh switch, wherein the off-time control circuit to generate a signal to the synthesizer control circuit responsive to an error signal sampled across the second capacitor to cause the synthesizer control circuit to adjust the timing of the second power transistor and the fourth replica transistor.

11. The system of claim 7, further comprising a second capacitor coupled between the first input of the transconductance stage and the ground.

12. The system of claim 11, further comprising a synthesizer control circuit to turn on the fifth switch to thereby reset a voltage on the second capacitor to the output voltage in each cycle of operation of the switching regulator.

13. The system of claim 7, further comprising a synthesizer control circuit configured to turn on the fifth switch once during each cycle of operation of the switching regulator.

14. A controller for at least partially controlling a switching regulator that includes first and second power transistors and provides a regulated output voltage, the controller comprising:
control circuit to control switching of the first and second power transistors;
an output voltage synthesizer including:
a synthesizer input coupled to an input of the switching regulator;
a first replica transistor coupled between the synthesizer input and a first node, the first replica transistor being a replica of the first power transistor;
a second replica transistor coupled between the first node and a ground, the second replica transistor being a replica of the second power transistor;
a resistor coupled between the first node and a second node;
a capacitor coupled between the second node and the ground;
a transconductance stage to generate a voltage difference based on a comparison of a voltage on the capacitor received at a first input of the transconductance stage to the regulated output voltage received at a second input of the transconductance stage and to generate an output signal in response to the voltage difference; and
a third switch coupled between the first and second inputs of the transconductance stage;
the third switch controlled to turn on during each cycle of operation of the switching regulator to reset the voltage on the capacitor to the regulated output voltage.

15. The controller of claim 14, further comprising a fourth switch coupled between the resistor and the first input of the transconductance stage.

16. The controller of claim 15, further comprising a fifth switch coupled to an output of the transconductance stage.

17. The controller of claim 16, further comprising a synthesizer control circuit including a second capacitor coupled between the first input of the transconductance stage and the ground, and an off-time control circuit coupled to the fifth switch, wherein the off-time control circuit is configured to generate a signal to the synthesizer control circuit responsive to an error signal sampled across the second capacitor to thereby cause the synthesizer control circuit to adjust a TOFF off timing of the second power transistor.

18. The controller of claim 14, further comprising a second capacitor coupled between the first input of the transconductance stage and ground.

19. The controller of claim 18, further comprising a synthesizer control circuit to turn on the third switch to thereby reset a voltage on the second capacitor to the regulated output voltage in each cycle of operation of the switching regulator.

20. The controller of claim 17, wherein the synthesizer control circuit to turn on the third switch after the output of the transconductance stage is sampled.

* * * * *